(12) United States Patent
Reinmuth (10) Patent No.: US 8,792,153 B2
(45) Date of Patent: Jul. 29, 2014

(54) MICROMECHANICAL COMPONENT, INTERMEDIATE PRODUCT PRODUCED BY A MANUFACTURING METHOD, AND MANUFACTURING METHOD FOR A MICROMECHANICAL COMPONENT

(75) Inventor: Jochen Reinmuth, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 106 days.

(21) Appl. No.: 13/586,363

(22) Filed: Aug. 15, 2012

(65) Prior Publication Data
US 2013/0044363 A1 Feb. 21, 2013

(30) Foreign Application Priority Data
Aug. 16, 2011 (DE) .......................... 10 2011 081 002

(51) Int. Cl.
*G02B 26/08* (2006.01)
*G02B 26/00* (2006.01)

(52) U.S. Cl.
CPC .................................. *G02B 24/0841* (2013.01)
USPC ...................................... 359/224.1; 359/290

(58) Field of Classification Search
CPC ............. G02B 26/001; G02B 26/0833; G02B 29/0841; G02B 26/105
USPC .............. 359/198.1, 199.2, 200.6, 224.1, 290
See application file for complete search history.

(56) References Cited

U.S. PATENT DOCUMENTS 7,813,028 B2 * 10/2010 Tsai et al. ..................... 359/290

FOREIGN PATENT DOCUMENTS

DE 10 2008 041 178 2/2010

* cited by examiner

*Primary Examiner* — William Choi
(74) *Attorney, Agent, or Firm* — Kenyon & Kenyon LLP (57) ABSTRACT

A micromechanical component having a displaceable part connected to a residual substrate by at least one spring, and including first and second subunits, between which an insulating intermediate layer and at least one semiconductor boundary layer is formed; an inner region of the first subunit, which inner region is aligned with the second subunit, being patterned out of a substrate using at least one cavity etched in a first etching direction; an outer region of the first subunit of the displaceable part, which outer region faces away from the second subunit, being patterned out of the substrate using at least one hollowed-out section etched in a second etching direction; the second subunit being patterned out of a semiconductor layer deposited onto the insulating intermediate layer and/or on the at least one semiconductor boundary layer using at least one continuous separating trench. Also described is a related manufacturing method.

5 Claims, 9 Drawing Sheets

MICROMECHANICAL COMPONENT, INTERMEDIATE PRODUCT PRODUCED BY A MANUFACTURING METHOD, AND MANUFACTURING METHOD FOR A MICROMECHANICAL COMPONENT

RELATED APPLICATION INFORMATION

The present application claims priority to and the benefit of German patent application no. 10 2011 081 002.1, which was filed in Germany on Aug. 16, 2011, the disclosure of which is incorporated herein by reference.

FIELD OF THE INVENTION

The present invention relates to a micromechanical component having a displaceable part connected to a residual substrate by at least one spring. In addition, the present invention relates to an intermediate product produced using a manufacturing method. Furthermore, the present invention relates to a manufacturing method for a micromechanical component having a displaceable part connected to a residual substrate by at least one spring.

BACKGROUND INFORMATION

A manufacturing method for a micromechanical component and a micromechanical component are discussed in DE 10 2008 041 178 A1. To produce an electrical drive of the micromechanical component, at least a first etch stop layer, a first electrode material layer, a second etch stop layer and a second electrode material layer are to be deposited on a substrate.

SUMMARY OF THE INVENTION

The exemplary embodiments and/or exemplary methods of the present invention provide a micromechanical component having the features described herein, an intermediate product that is produced by a manufacturing method and has the features described herein, and a manufacturing method for a micromechanical component having a displaceable part connected to a residual substrate by at least one spring, the manufacturing method having the features described herein.

The exemplary embodiments and/or exemplary methods of the present invention provide a micromechanical component, which has a displaceable part connected to a residual substrate by at least one spring and may be manufactured simply and comparatively inexpensively. In particular, an expensive substrate material, such as, in particular, a SOI substrate, is not needed for manufacturing the micromechanical component. In addition, it is not necessary to deposit several electrode material layers for manufacturing the micromechanical component.

Furthermore, the micromechanical component may be produced using a process sequence, in which thin structures of the micromechanical component, such as electrodes, may be patterned more precisely with a justifiable energy expenditure. Consequently, the intermediate spacings of the individual components of the micromechanical component may be separated from one another by shorter distances. This is often associated with advantageous functioning of the individual components with one another. For example, electrodes, between which comparatively small gap distances are present, may be formed on the micromechanical component. Consequently, the advantageous interaction of the electrodes already takes place at a lower driving voltage, which means that a method of functioning of the electrodes that saves more energy is implemented.

Furthermore, the micromechanical component producible with the present invention may be manufactured using a process sequence, which is compatible with known micromechanical processes. One may also adapt this to say that the manufacturing method of the present invention, which is described below in further detail, may be implemented using known micromechanical processes.

The exemplary embodiments and/or exemplary methods of the present invention also provide a manufacturing method for a micromechanical component having a displaceable part connected to a residual substrate by at least one spring, where the individual layers of the layer construction are constructed one after another; the patterning of the individual units of the micromechanical component already being able to take place after deposition of the specific layer. Subsequently, the at least partially patterned units may be buried in a simple manner prior to depositing the next layer. Using this approach of the manufacturing method, many structural elements of the micromechanical component formed later may be laid out simultaneously. This allows the individual structural elements to be produced at a high degree of precision with a justifiable expenditure of energy. In addition, the process sequence is simplified by this approach and requires a small number of patterning operations.

Additional features and advantages of the present invention are explained below, with reference to the figures.

DETAILED DESCRIPTION

The technology of the exemplary embodiments and/or exemplary methods of the present invention is described below in light of a micromechanical component configured as a micromirror and in light of a manufacturing method for producing a micromirror. The option described below for utilizing the technology of the exemplary embodiments and/or exemplary methods of the present invention allows, in particular, a highly cost-effective micromirror to be produced. In addition, markedly lower process tolerances and an increase in the yield of manufactured micromirrors in comparison with an SOI process according to the related art may be effected by the manufacturing process for producing the micromirror.

However, the use of the technology of the exemplary embodiments and/or exemplary methods of the present invention is not limited to a micromirror. In place of a micromechanical component, whose displaceable part has a reflecting surface, the technology of the exemplary embodiments and/or exemplary methods of the present invention is also applicable to other micromechanical components having at least one displaceable part, which is connected to a residual substrate by a spring.

FIG. 1A to 1D show a general plan view and three cross-sections for representing a specific embodiment of the micromechanical component.

Figure 1A:
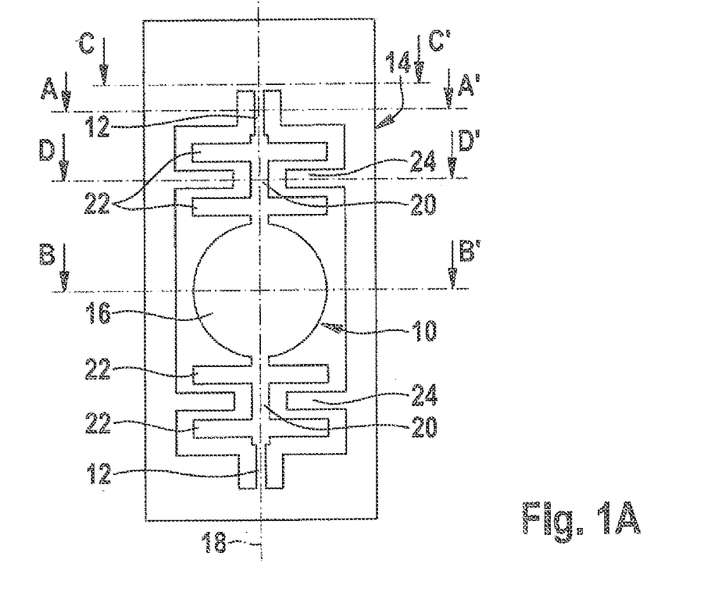
FIGS. 1A to 1D show a general plan view and three cross-sections for representing a specific embodiment of the micromechanical component.

The micromechanical component schematically represented in FIG. 1a in a general plan view includes a displaceable part 10, which is connected to a residual substrate by at least one spring 12. The residual substrate (not shown in FIG. 1A) is part of a holder 14.

By way of example, displaceable part 10 includes a mirror element 16, which is displaceable about an axis of rotation 18 in its orientation with respect to holder 14. However, the construction of the micromechanical component described below is not limited to a displaceable part 10 having mirror element 16. Instead, the following descriptions regarding displaceable part 10 are only to be understood as exemplary.

Optionally, displaceable part 10 may also have two rib elements 20, which are aligned with axis of rotation 18 and are situated at opposite ends of mirror element 16. At its end pointed away from mirror element 16, each of the two rib elements 20 may be connected to holder 14 by one spring 12. The at least one spring 12 of the micromechanical component may take the form of a torsion spring. However, the manufacturability of the at least one spring 12 is not limited to torsion springs.

The micromechanical component may include a drive unit, such as, in particular, an electrical drive. At least a partial region of displaceable part 10 may be formed as at least one actuator electrode finger 22. In this case, the micromechanical component also includes at least one stator electrode finger 24 assigned to the at least one actuator electrode finger 22. For example, several actuator electrode fingers 22 may extend perpendicularly away from axis of rotation 18 on both sides of rib elements 20. This ensures that rib elements 22 and mirror element 10 are movable together via the at least one actuator electrode finger 22. In contrast, the at least one stator electrode finger 24 may be rigidly mounted to holder 14 in such a manner, that its position and its setting with respect to holder 14 remains unchanged in spite of a displacement of displaceable part 10.

It should be emphasized that the micromechanical component described below is not limited to a particular attachment position of electrode fingers 22 and 24, a particular number of electrode fingers 22 and 24, or to one layout. (In particular, the number of electrode fingers 22 and 24 shown in FIG. 1A, as well as their positioning relative to each other, are only to be interpreted as exemplary.)

Figure 1B:
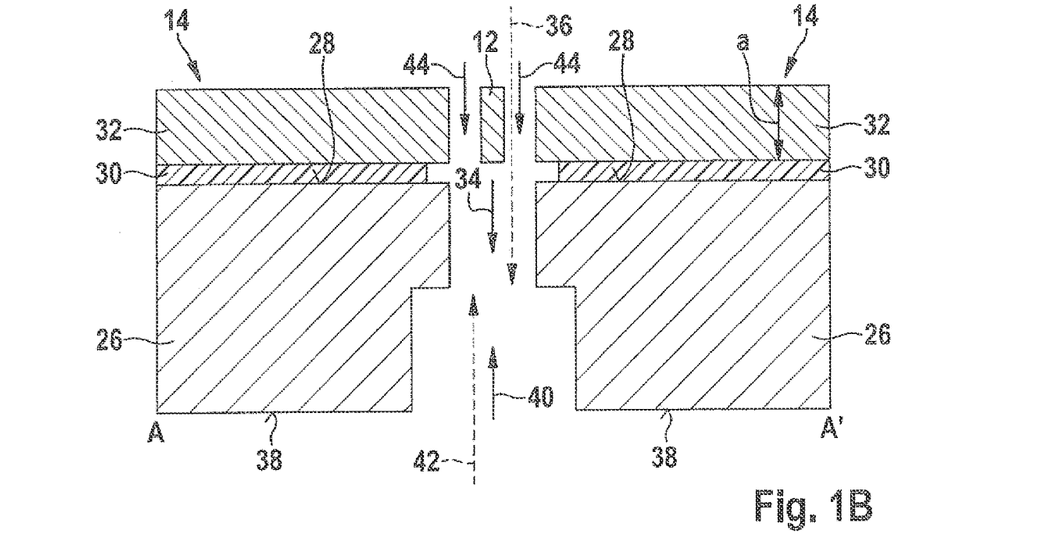

FIG. 1B shows a cross section of the micromechanical component along a line AA' of FIG. 1A oriented perpendicularly to axis of rotation 18. Line AA' runs through regions of holder 14 and of the at least one spring 12.

As is apparent in FIG. 1B, in the specific embodiment illustrated, holder 14 is made up of a residual substrate 26, a residual insulating layer 30 at least partially covering a front side 28 of residual substrate 26, and a residual semiconductor layer 32 situated on residual insulating layer 30. Residual substrate 26 includes at least one semiconductor material, such as silicon. Residual substrate 26 may be made of silicon.

Residual insulating layer 30 includes at least one insulating material, such as silicon oxide. However, the ability to form residual insulating layer 30 is not limited to the (exclusive) use of silicon oxide. In addition, a multitude of pure semiconductor materials or compounds of at least one semiconductor material are usable for residual semiconductor layer 32. Residual semiconductor layer 32 may also be inexpensively made out of silicon.

Residual substrate 26 has at least one etched-in cavity 34 on its front side 28. The at least one cavity 34 is etched in a first etching direction 36, which is oriented in a direction from the front side to a back side 38 of residual substrate 26 that faces away from front side 28. In addition, at least one hollowed-out section 40 is formed at back side 38. The at least one hollowed-out section 40 is etched into residual substrate 26 in a second etching direction 42 opposite to first etching direction 36. In addition, at least one separating trench 44 going through residual semiconductor layer 32 is etched into it 32 along first etching direction 36.

With the aid of the at least one separating trench 44, e.g., the at least one spring 12 may be formed from the material of residual semiconductor layer 32. This may also be paraphrased to say that the at least one spring 12 is patterned out of a semiconductor layer, which later forms residual semiconductor layer 32. In this case, the at least one spring 12 is formed to be self-supporting over the at least one cavity 34. Therefore, the at least one spring 12 and displaceable part 10 may span the at least one cavity 34.

By patterning out the at least one spring 12 from the semiconductor layer, a thickness of the at least one spring 12, which thickness is oriented perpendicularly to an outer surface of the semiconductor layer/residual semiconductor layer 32, is reliably definable using a deposition thickness a of semiconductor layer/residual semiconductor layer 32. (Using the manufacturing method described below in further detail, a width and a length of the at least one spring 12, which are oriented parallel to the outer surface of semiconductor layer/residual semiconductor layer 32, may be formed within a small tolerance range.

For a further explanation of the construction of trenches 34, 40 and 44, reference is likewise made to the manufacturing method described below in further detail.

Figure 1C:
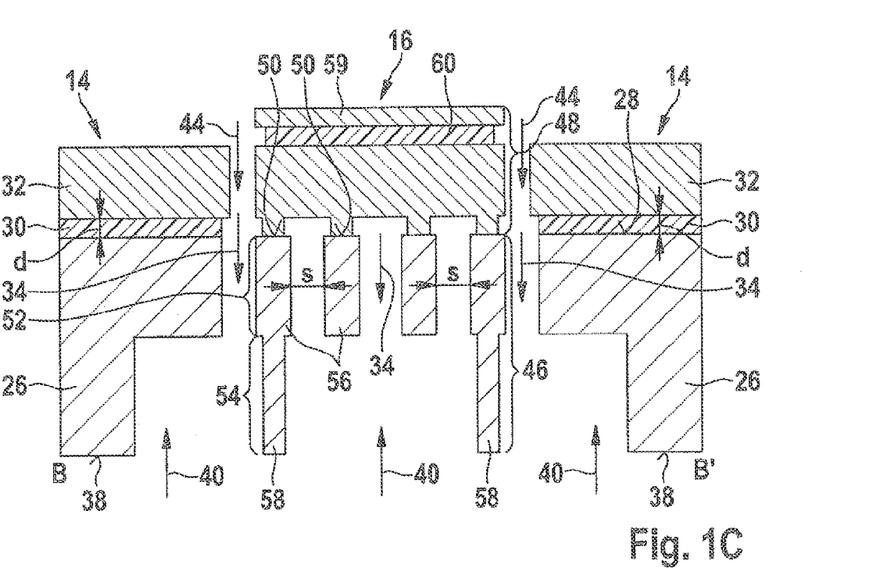

FIG. 1C shows a cross section of the micromechanical component along a line BB' of FIG. 1A oriented perpendicularly to axis of rotation 18. Line BB' runs through regions of holder 14 and of displaceable part 10, in particular, of mirror element 16.

As is apparent from the cross-section of FIG. 1C, displaceable part 10 includes a first subunit 46 and a second subunit 48. First subunit 46 and second subunit 48 are separated from one another by an insulating intermediate layer situated between them (and not sketched in FIG. 1C) and by at least one semiconductor boundary layer 50. Semiconductor boundary layer 50 may be understood as a boundary layer, inner surface and/or intermediate surface, which is formed when a layer material having at least one semiconductor material is deposited onto a fully crystallized substrate outer surface. Therefore, even in the case of subunits 46 and 48, the at least one semiconductor boundary layer 50 may be demonstrated microscopically to be made of the same material. For example, semiconductor boundary layer 50 may be detectable optically and/or by an atomic force microscope on the basis of a changed solid structure.

An inner region of first subunit 46 oriented towards second subunit 48 is formed with the aid of the at least one cavity 34 etched in first etching direction 36. In contrast, an outer region 54 of first subunit 46 is formed with the aid of the at least one hollowed-out section 40, which is etched in second etching direction 42. One may paraphrase this to say that (together with residual substrate 26) inner region 52 of first subunit 46 is patterned out of a substrate with the aid of the at least one cavity 34 etched in first etching direction 36, and that outer region 54 of first subunit 46 is patterned out of the substrate with the aid of the at least one hollowed-out section 40 etched in second etching direction 42.

Using the at least one continuous separating trench 44, second subunit 48 is patterned out of a semiconductor layer deposited onto the at least one insulating intermediate layer and/or onto the at least one semiconductor boundary layer 50. (After the manufacturing process, residual semiconductor layer 32 remains from the semiconductor layer.) As described below in further detail, three different etching steps may be consequently executed completely independently of each other for shaping displaceable part 10.

For example, the different etching directions of trenches 34, 40 and 44 may be detected at the micromechanical component by, for example, an analysis using a microscope, a break, a section, a ground section and/or a REM. The ability to form displaceable part 10, using the etching steps executable independently of one another, is achieved by the manufacturing method described below in further detail.

As explained below in further detail, the advantageous manufacturing method allows the at least one cavity 34 to be formed in such a manner, that it has a maximum expansion s parallel to the at least one insulating intermediate layer and/or to the at least one semiconductor boundary layer 50, which is greater than a layer thickness d of residual insulating layer 30 or of the insulating intermediate layer (not sketched) by at least a factor of 2. Maximum extension s of the at least one cavity 34 may be greater than layer thickness d of residual insulating layer 30 or of the insulating intermediate layer (not shown) by at least a factor of 3, in particular, by at least a factor of 5, and may be by at least a factor of 8.

In addition, the forming of displaceable part 10 with the aid of trenches 34, 40 and 44 produces a high degree of design freedom, which means that the shape of displaceable part 10 may be effectively adapted to the future use. For example, second subunit 48 having the reflective surface of mirror element 16 may be formed to be at least partially planar, while inner region 52 of first subunit 46 and/or outer region 54 of first subunit 46 may include stabilizing ribs 56 and 58 for stabilizing the region of second unit 48 that is formed to be planar. The at least partially planar construction of second subunit 48 optionally allows a reflective coating 59 of mirror element 16 to be deposited on it in a simple manner, the reflective coating may be separated from second subunit 48 by insulation 60. A large degree of design freedom is also possible for stabilizing ribs 56 of inner region 52 and stabilizing ribs 58 of outer region 54. For example, stabilizing ribs 56 of inner region 52 may have a first width parallel to the at least one insulating intermediate layer and/or to the at least one semiconductor boundary layer 50, while stabilizing ribs 58 of outer region 54 have a smaller, second width parallel to the at least one insulating intermediate layer and/or to the at least one semiconductor boundary layer 50. Further design freedom is likewise feasible in the forming of stabilizing ribs 57 and 58 for ensuring an advantageous rigidity of mirror element 16.

Figure 1D:
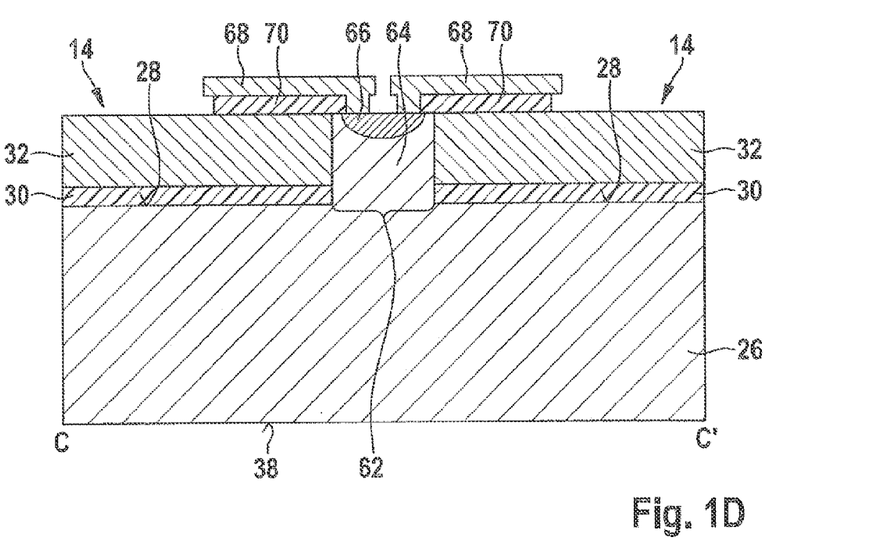

FIG. 1D shows a cross section of the micromechanical component along a line CC' of FIG. 1A oriented perpendicularly to axis of rotation 18. Line CC' runs through holder 14 at an anchoring region of the at least one spring 12.

As can be seen in FIG. 1D, residual insulating layer 30 has a contact window 62 at the anchoring region of the at least one spring 12 to holder 14. By depositing the material for forming the semiconductor layer, out of which at least portions of displaceable part 10 and the at least one spring 12 and residual semiconductor layer 32 are patterned, a monocrystalline semiconductor region 64 (in residual semiconductor layer 32) is formed over contact window 62. A piezoelectrically sensitive resistor 66 is formed at an outer side of monocrystalline semiconductor region 64 facing away from contact window 62. Piezoelectrically sensitive resistor 66 is contacted by two lines 68. Lines 68 may be electrically insulated from monocrystalline semiconductor region 64 and residual semiconductor layer 32 by at least one piece of insulation 70 formed underneath them.

The easily manufacturable units 64 through 68 implement a measuring device for determining a deflection magnitude with regard to a rotation of displaceable part 10 about axis of rotation 18, by ascertaining a temporal change in an intensity of a current flowing through the piezoelectric resistor or a temporal change in a voltage applied to piezoelectric resistor 66. A rotation of displaceable part 10 about axis of rotation 18 produces a mechanical stress in monocrystalline semiconductor region 64, which is detectable by ascertaining the temporal change in one of the mentioned variables. The measuring device made up of units 64 through 68 ensures an advantageous robustness and a reliable measuring accuracy.

It is emphasized that regions of displaceable part 10 other than mirror element 16 may also include partial regions of first subunit 46 and second subunit 48. For example, the at least one actuator electrode finger 22 of displaceable part 10 may have a first actuator electrode finger region contained by first subunit 46 and a second actuator electrode finger region contained by second subunit 48. The first actuator electrode finger region and the second actuator electrode finger region may be separated from one another by the at least one insulating intermediate layer. In this manner, it may be ensured that different potentials may be applied to the first actuator electrode finger region and the second actuator electrode finger region of the at least one actuator electrode finger 22.

In this case, it is also advantageous when the at least one stator electrode finger 24 includes a first stator electrode finger region contained by residual substrate 26 and a second stator electrode finger region contained by residual semiconductor layer 32 and electrically insulated from the first stator electrode finger region. In particular, residual insulating layer 30 may be used for electrically insulating the first stator electrode finger region from the second stator electrode finger region of the at least one stator electrode finger 24.

Therefore, the micromechanical component described here may easily be provided with an electrostatic drive made up of vertically divided electrodes. The vertically divided electrodes may be understood as stator and actuator electrodes, which are subdivided in a plane of the at least one insulating intermediate layer and/or of residual insulating layer 30. This vertically divided design of the electrodes renders superfluous a set-up of the actuator and stator electrodes interacting with one another at different levels.

Therefore, in the case of vertically subdividing the electrodes, the first actuator electrode finger region, the second actuator electrode finger region, the first stator electrode finger region, and the second stator electrode finger region may be contacted by a conductor track system of the micromechanical component in such a manner, that, simultaneously, a first potential may be applied to the first actuator electrode finger region and the second stator electrode finger region, and a second potential different from the first potential may be applied to the second actuator electrode finger region and the first stator electrode finger region. By applying the potentials to the electrode finger regions mentioned here, the at least one actuator electrode finger 22 may be lifted out of its starting plane. The displacement direction of the at least one actuator electrode finger 22, i.e., the direction of rotation of displaceable part 10, may be set via the selection of the potentials. In particular, the direction of rotation may be changed by rotating the wiring by 180°.

As is explained below in more detail, the electrostatic drive described in the preceding paragraphs may be made inexpensively, and with a comparatively low degree of energy expenditure, from vertically divided electrodes.

FIG. 2A to 2M show cross-sections of a substrate for illustrating a specific embodiment of the manufacturing method.

Using the following description, e.g., an implementation of the manufacturing method for producing the above-described micromechanical component is explained. (The cross-sections schematically represented in FIG. 2A to 2M run perpendicular to axis of rotation 18, along line DD' of FIG. 1A, which runs axially through at least one stator electrode finger.) However, it is emphasized that the implementability of the method is not limited to the manufacture of this specific embodiment of the micromechanical component. Instead, a multitude of different types of a micromechanical component having a displaceable part connected to a residual substrate by at least one spring may be produced using the manufacturing method described in the following.

Figure 2A:
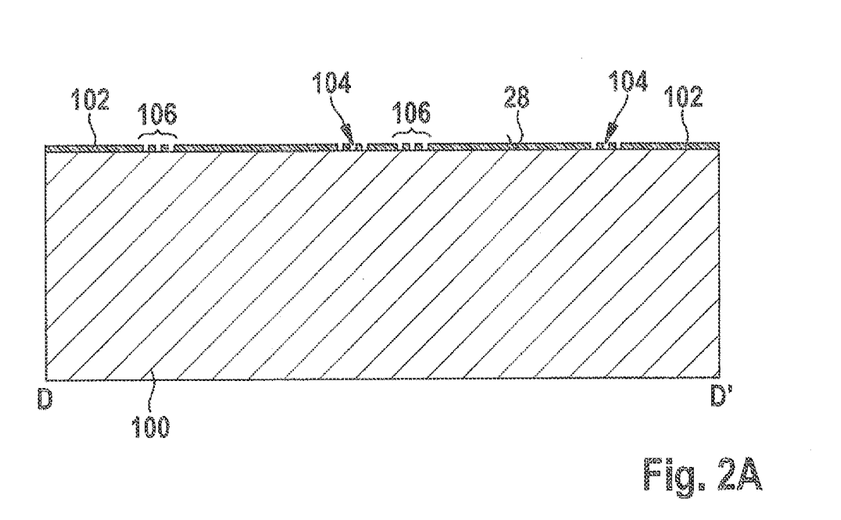
FIGS. 2A to 2M show cross-sections of a substrate for illustrating a specific embodiment of the manufacturing method.

FIG. 2A shows a cross-section of a substrate 100 after forming an insulating layer 102 having through-openings 104 on a front side 28 of substrate 100, in the form of an etching mask. Substrate 100 may be, in particular, a standard silicon substrate. However, in place of this cost-effective exemplary embodiment, a multitude of differently configured substrates may also be used for the method described below.

For example, insulating layer 102 may be a hard-surface mask made of a dielectric. For example, a TEOS layer may be deposited to form insulating layer 102. The forming of such an insulating layer 102 with a tensile stress results in the insulating layer 102 not having a tendency to bend in the subsequent method steps. However, it is emphasized that materials free of tensile stress may also be used for the insulating layer. For example, insulating layer 102 may also be formed by thermal oxidation; in a thermal step, an oxide layer being grown on a substrate 100 made of silicon.

Through-openings 104 may be formed over substrate regions, which are to be etched in at least one subsequent method step. Through-openings 104 may be formed by opening/etching parts of insulating layer 102, using a photomask.

While forming the insulating layer 102 subsequently used as an etching mask by etching through-openings 104, at least one grating 106 may be formed in at least one partial region of insulating layer 102. To that end, through-holes 104 may be formed in the at least one partial region of insulating layer 102 in such a manner, that a grating 106 made out of the material of insulating layer 102 remains. The remaining grating 106 may be formed in a multitude of different shapes. In one specific embodiment that is easy to implement, grating 106 may include individual ribs, which are made of the material of insulating layer 102 and run parallel to one another. The individual ribs running parallel to one another may be connected to insulating layer 102. As an alternative to the embodiment of the grating 106 described here, which is simple to manufacture, the ribs may also intersect and be connected to one another in this manner. If insulating layer 102 has compressive stress, then it is also advantageous to position/form the ribs in such a manner, that the compressive stress may be compensated for by bending of the ribs in the plane of insulating layer 102. In addition, the ribs may also be meander-shaped, for example.

The ribs of the at least one grating 106 may be formed to be so narrow, that their widths parallel to front side 28 are less than the width of through-holes 104 parallel to front side 28 and/or less than the layer thickness of insulating layer 102. Parallel to front side 28, a width, which is less than the layer thickness of insulating layer 102, may also be used for through-openings 104. Since insulating layer 102 is used as an etching mask in a further method step, a low area ratio of the ribs to through-holes 104 is advantageous for allowing a high etching rate.

Figure 2B:
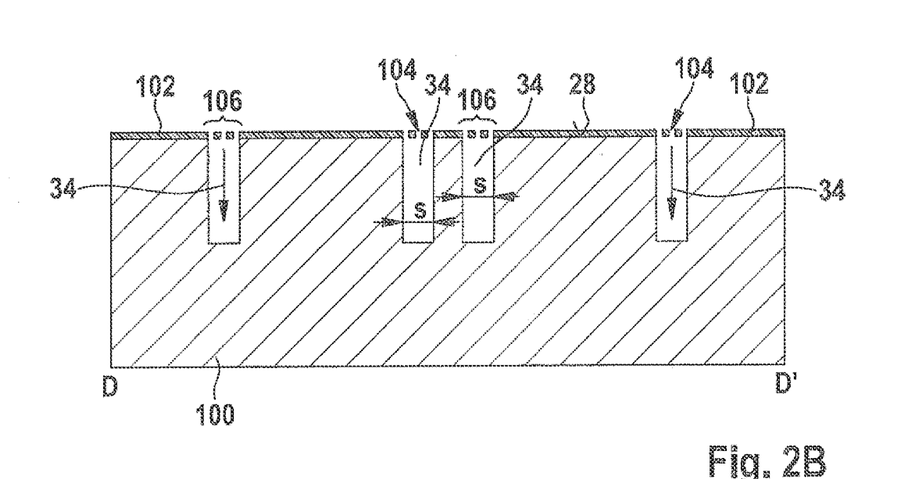

FIG. 2B shows substrate 100 after the etching of at least one cavity 34 through front side 28, using the insulating layer 102 as an etching mask, the insulating layer being formed on the front side of substrate 100 and having through-openings 104. An inner region of a first subunit of the displaceable part of the micromechanical component to be displaced is at least preformed by the etching of the at least one cavity 34. In this context, regions of the insulating layer adjacent to through-openings 104, in particular, the at least one grating 106, are undercut. Particularly in the case of a narrow design of the ribs, undercutting of the at least one grating 106 may be implemented simply and reliably.

The etching step executed using insulating layer 102 as an etching mask may be an anisotropic trenching process. By suitably selecting the process parameters for the etching and passivation steps of the anisotropic trenching process, sufficient/complete undercutting of the ribs of the at least one grating 106 (that are also wider) may be reliably ensured. The thin ribs may also be undercut in a process step subsequent to the trenching process, by removing the passivation layer formed during the trenching process (e.g., using an etching step). Subsequently, in a(n) (which may be isotropic) etching process, e.g., using $SF_6$, $ClF_3$, $XeF_2$ and/or another etching gas, the silicon walls situated below the ribs of the at least one grating 106 may be removed.

With the aid of the method described here, an advantageously large, maximum extension s of the at least one cavity 34 parallel to front side 28 may be produced. Maximum extension s of the at least one cavity 34 is discussed below in even further detail.

Figure 2C:
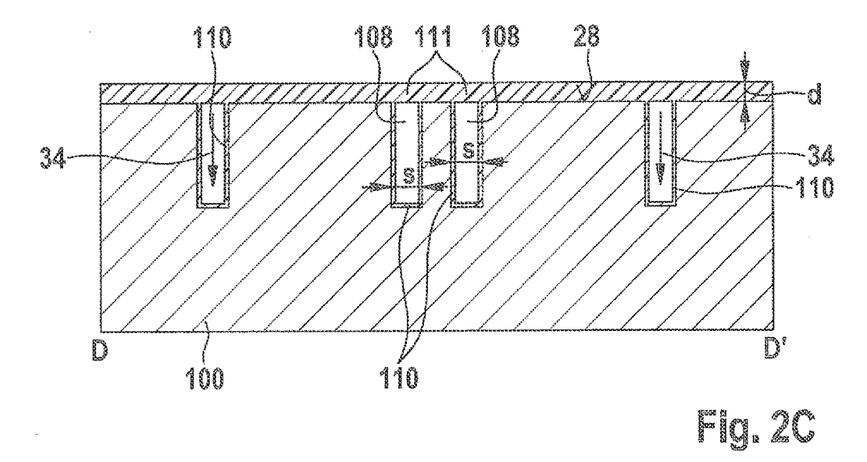

FIG. 2C shows a cross-section of substrate 100 after sealing the through-openings by depositing a sealing material. In this context, a hollow space 108 of the at least one cavity 34 is sealed off from an outer surrounding area of substrate 100 by the sealing material. Particularly in the case of an embodiment of the through-openings having a short width parallel to front side 28, the sealing of the at least one hollow space 108 may be accomplished rapidly and reliably.

During the sealing, as a rule, a thin layer 110 of the sealing material, which covers the at least one wall and the at least one base of the at least one cavity 34, is formed inside the at least one cavity 34. The thickness of this layer 110 may be adjusted via selection of the sealing material and the grating parameters.

An electrically insulating material, such as the material of insulating layer 102, in particular, silicon oxide, may be used as a sealing material. However, the feasibility of the method step described here is not limited to a particular sealing material. If an electrically insulating material is used as a sealing material, front side 28 of substrate 100 is at least partially covered by a sealed insulating layer 111, whose layer thickness is greater than the layer thickness of previous insulating layer 102. (Sealed insulating layer 111 may be understood as a layer of the materials of previous insulating layer 102 and of the sealing material.)

Using the manufacturing method described here, a maximum extension s of the at least one cavity 34 parallel to front side 28 may be formed, which is greater than a layer thickness d of sealed insulating layer 111 (after deposition of the sealing material) by at least a factor of 2. Maximum extension s may be greater than layer thickness d of sealed insulating layer 111 by, in particular, a factor of 3, which may be by a factor of 5, and may be by a factor of 8.

Figure 2D:
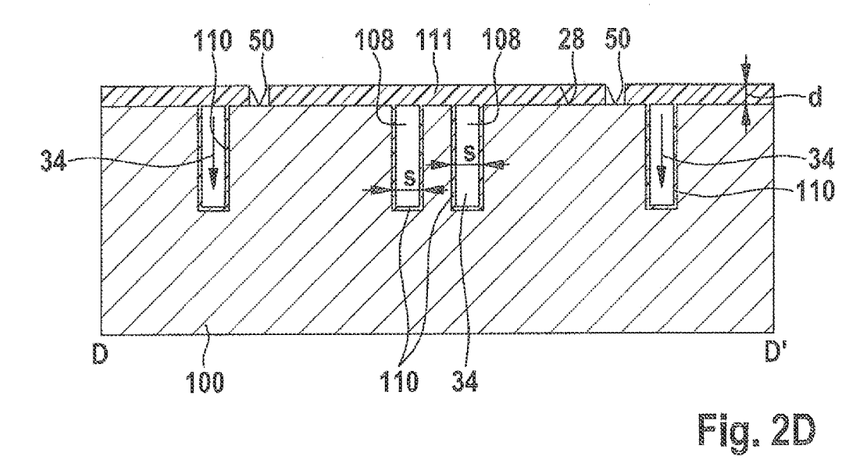

Optionally, using a further etching process for etching sealed insulating layer 111, at least one subsequent semiconductor boundary layer 50 may be exposed at front side 28 of substrate 100. One may also describe this as forming a contact region between the later subunits of the displaceable part of the micromechanical component. The result of this optional etching process is represented in FIG. 2D.

Figure 2E:
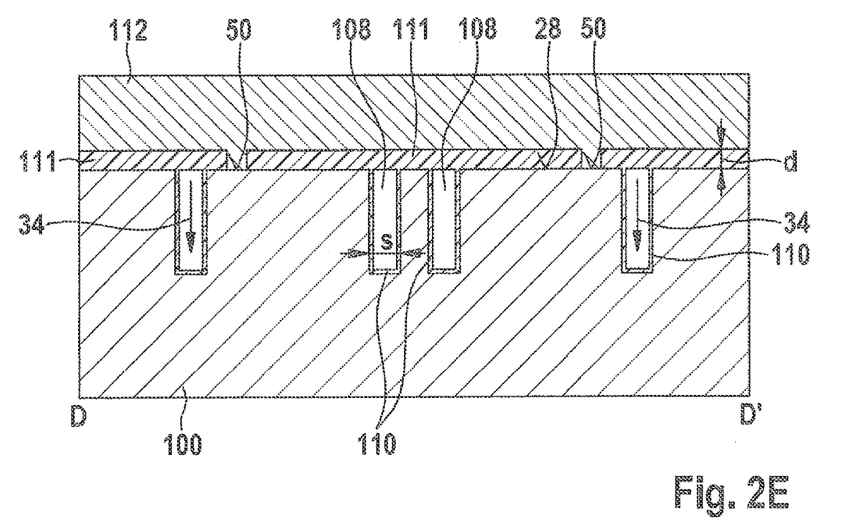

FIG. 2E shows a cross-section of substrate 100 after depositing a semiconductor layer 112 on sealed insulating layer 111 and/or on the at least one semiconductor boundary layer 50. The semiconductor layer 112 formed on sealed insulating layer 111 may be a polysilicon layer, for example. In one advantageous specific embodiment, epitaxial polysilicon deposition using an LPCVD polysilicon starting layer or at least one auto-seed epitaxial layer is used for forming semiconductor layer 112.

For a later measuring device for ascertaining a deflection of a displaceable part, in the case of operating the finished micromechanical component, at least one monocrystalline semiconductor region is optionally formed during the growth of semiconductor layer 112. (The piezoresistor and other components of the measuring device may be formed later on the monocrystalline semiconductor region.)

In addition, semiconductor layer 112 may be doped either during the epitaxial process or after it. Consequently, conductive partial regions of semiconductor layer 112 may be formed, which are useable, for example, as electrode regions during operation of the micromechanical component. Semiconductor layer 112 may have a layer thickness between 10 and 120 μm. Semiconductor layer 112 may optionally be polished, in order to ensure a low roughness and/or a specified layer thickness of semiconductor layer 112.

Figure 2F:
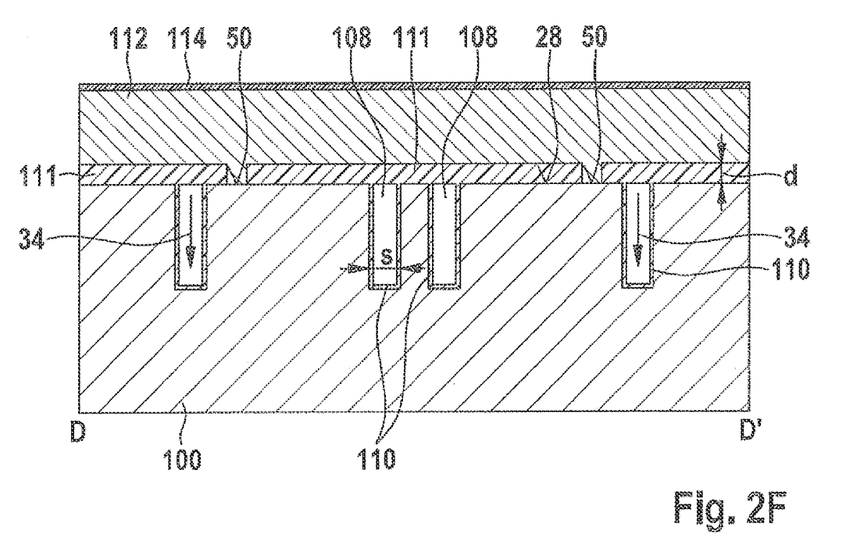

FIG. 2F shows a cross-section of semiconductor substrate 100 after deposition of an outer insulating layer 114 on semiconductor layer 112.

Figure 2G:
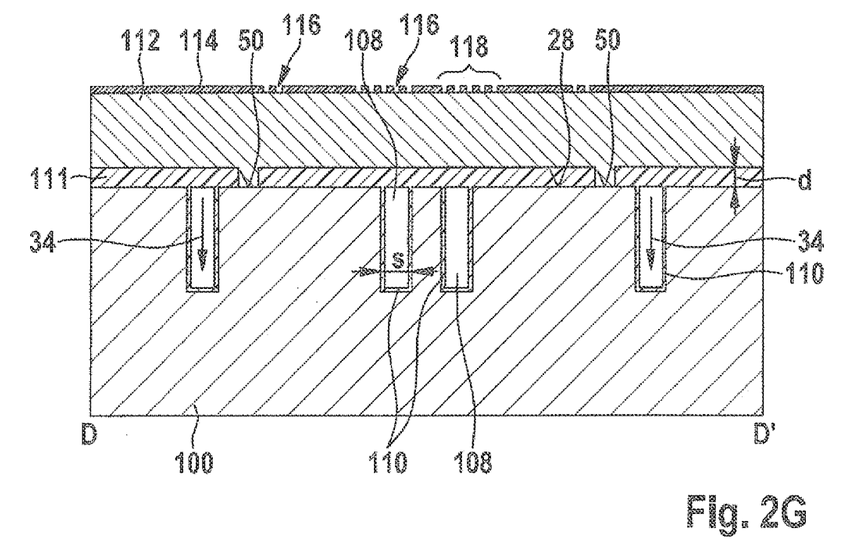

To use outer insulating layer 114 as an etching mask in a further etching process, at least one through-opening 116 may be formed in it. In particular, using the at least one through-opening 116, at least one grating 118 comparable to the previously described gratings may be formed in outer insulating layer 114, as shown in FIG. 2G.

Figure 2H:
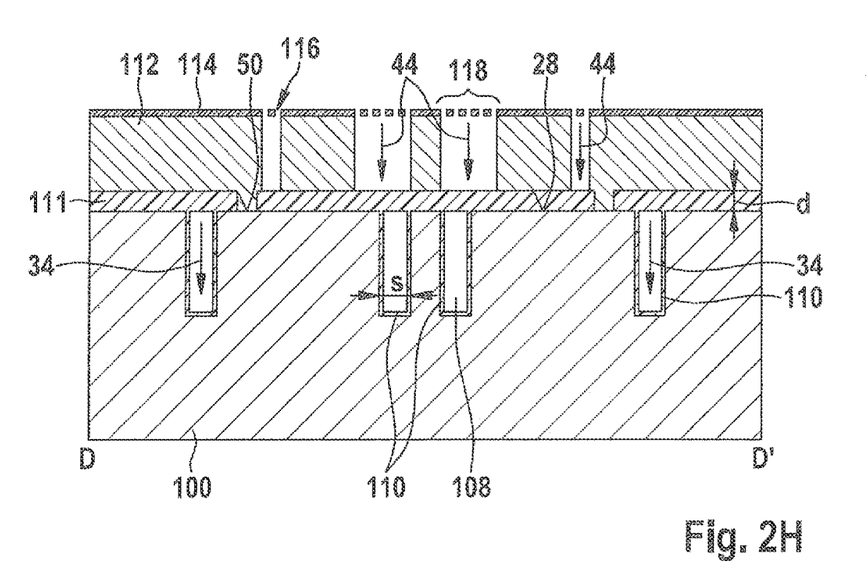

FIG. 2H shows a cross-section of semiconductor substrate 100 after preforming/patterning out at least one subsequent, second subunit of the displaceable part of the micromechanical component with the aid of at least one separating trench 44 passing through semiconductor layer 112. In particular, the at least one separating trench 44 may be formed by undercutting the at least one grating 118 formed in outer insulating layer 114. Sealed insulating layer 111 may be used as an etch stop layer during the etching of the at least one separating trench 44.

Figure 2I:
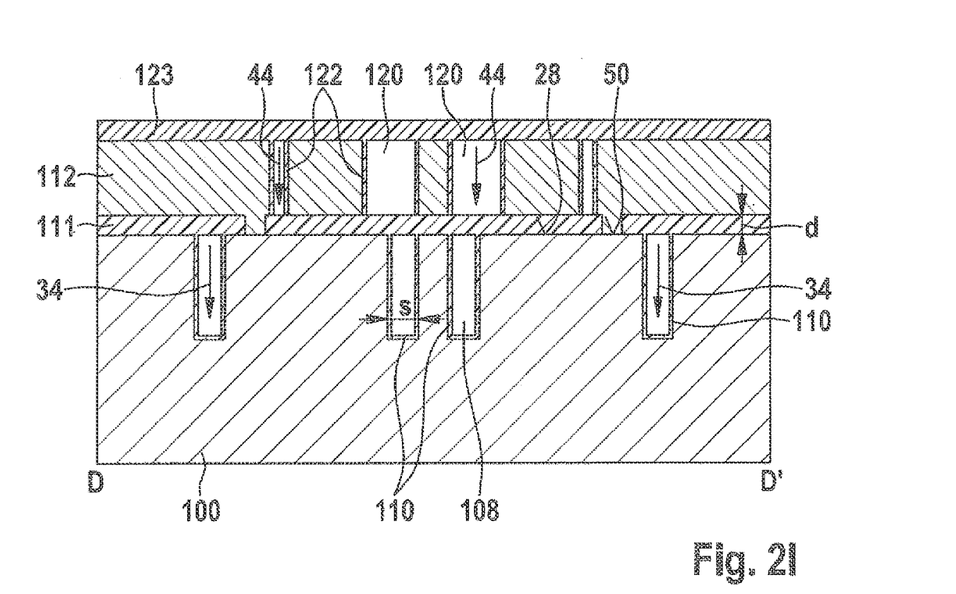

By depositing a further sealing material, the at least one through-opening 116 in outer insulating layer 114 may be sealed. In this context, the at least one hollow space 120 of the at least one separating trench 44 may also be sealed off from an outer surrounding area of substrate 100. In addition, at least one thin layer 122 of sealing material, which covers the at least one wall and the at least one base of the at least one separating trench 44, may be formed in this method step. The sealed outer insulating layer 123 formed on semiconductor layer 112 during the sealing is shown in FIG. 2I.

Figure 2J:
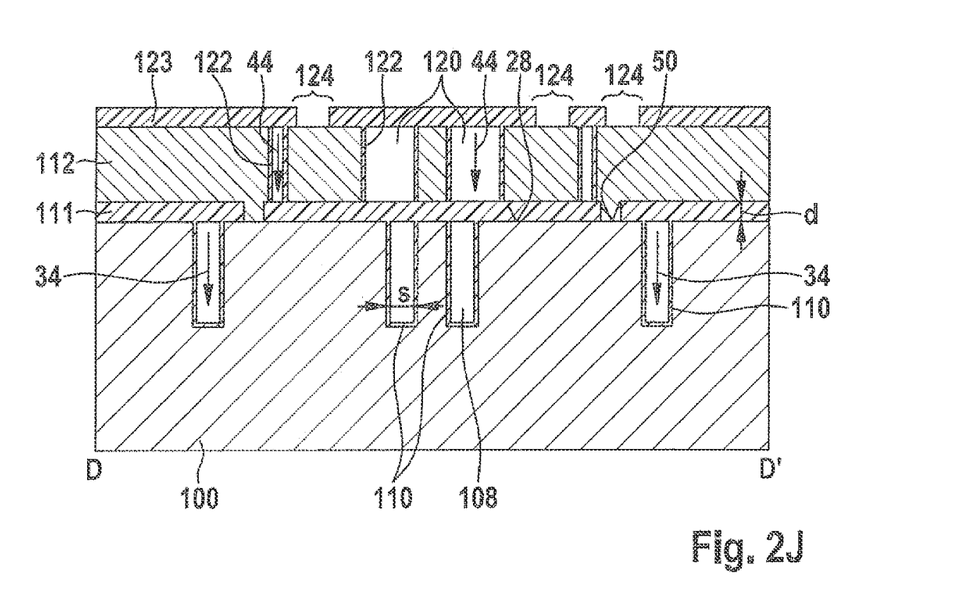

FIG. 2J shows a cross-section of substrate 100 after exposing at least one subsequent contact surface 124 of the micromechanical component. In particular, the (optional) method step of FIG. 2J may be used for forming a contacting area for a later electrode region of the finished micromechanical component.

In addition, at least one conductive material 126 may be deposited on sealed outer insulating layer 123 and/or on the at least one contacting region 124. Conductive material 126 may be, in particular, a metal. Using conductive material 126, e.g., conductor tracks may be patterned, which contact the later electrode regions and/or at least one other electronic component of the finished micromechanical component. Using conductive material 126, a reflective layer for a mirror element of the finished micromechanical component may also be formed. (In one labor-saving specific embodiment, a metallic layer formed by conductive material 126 may also be used as a mirror surface.)

Figure 2K:
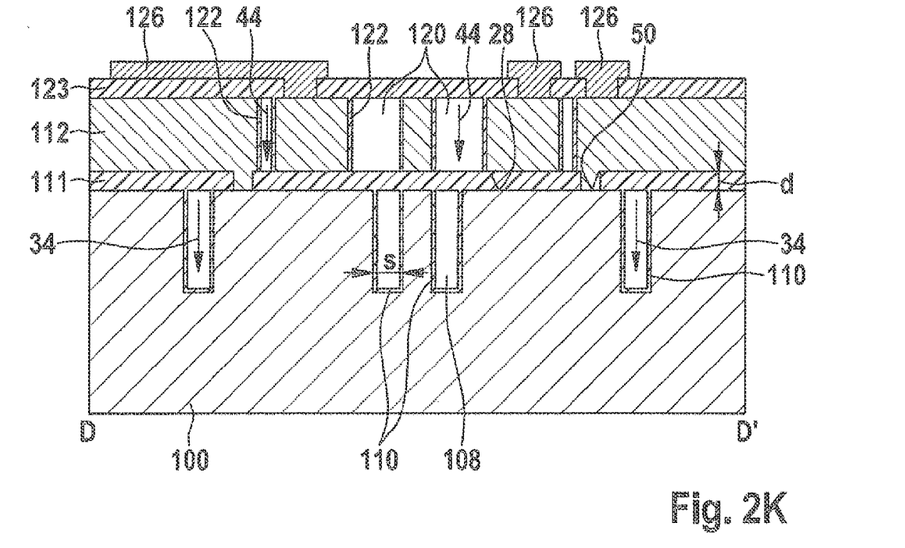

As an option, a further reflective material may also be deposited during the method step shown in FIG. 2K. In addition, at least one piezoresistor may be formed in the monocrystalline semiconductor region. Other electronic components may also be produced during this method step.

Figure 2L:
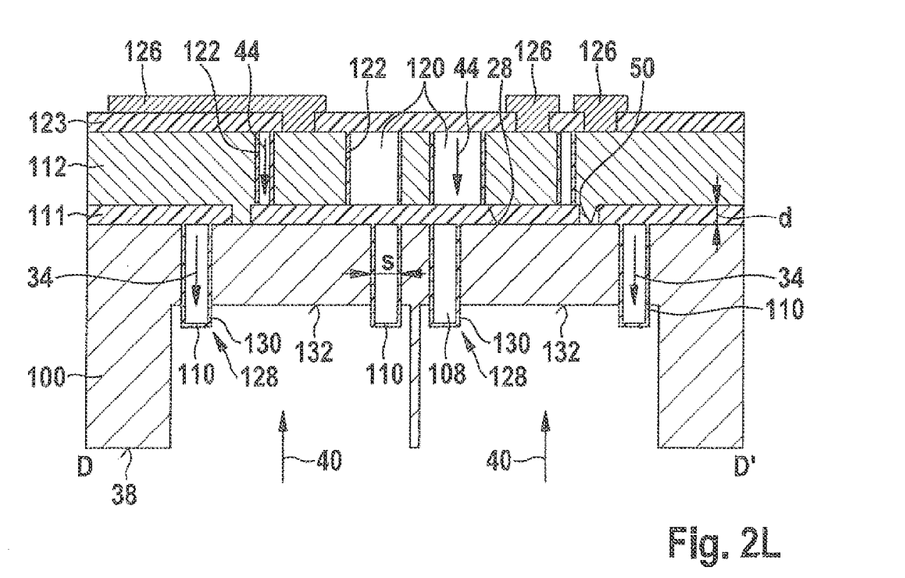

FIG. 2L shows a cross-section of substrate 100 after etching at least one hollowed-out section 40 into a back side 38 of substrate 100 facing away from front side 28, to form an outer region of the subsequent, first subunit. During the etching of the at least one hollowed-out section 40, at least one inner region 128 of the at least one cavity 34 pointed away from front side 28 is stripped of a substrate material of substrate 100 previously surrounding the specific cavity inner region 128.

The etching of the at least one hollowed-out section 40 may also be referred to as a back-side trench. This back-side trench may be produced with the aid of a resist mask and/or a hard-surface mask. During the etching of the at least one hollowed-out section 40, at least one trench designatable as a hollowed-out section 40 is etched up to at least the level/depth of the at least one cavity 34. To that end, thin layer 110 of the cover material, which is made of, e.g., an oxide material, may be used as an etch stop layer in the at least one cavity 34. In contrast, in the regions of substrate 100 not having a cavity 34 (and not having thin layer 110), the at least one hollowed-out section 40 may be etched deeper into substrate 100. The sum of the maximum depth of the at least one hollowed-out section 40 and the maximum depth of the at least one cavity 34 may be greater than the layer thickness of substrate 100.

In one specific embodiment, the maximum depth of the at least one hollowed-out section 40 is selected so that the remaining residual height of substrate 100, i.e., the difference between the layer thickness of substrate 100 and the maximum depth of the at least one hollowed-out section 40, is greater than the layer thickness of semiconductor layer 112. In such a setup, the maximum deflection of the displaceable part and the force for displacing the displaceable part is determined by the layer thickness of semiconductor layer 112. Therefore, since this layer thickness may be set easily, these functional parameters may be reliably set in a simple manner.

Consequently, FIG. 2L shows an intermediate product, which is producible by a manufacturing method having the steps: etching at least one cavity 34 through a front side 28 of a substrate 100, using an insulating layer 102 as an etching mask, the insulating layer being formed on front side 28 of substrate 100 and having through-openings 104, regions of insulating layer 102 adjacent to through-openings 104 being undercut; sealing through-openings 104 by depositing a sealing material, a hollow space 108 in the at least one cavity 34 being sealed off from an outer surrounding area by the sealing material; depositing at least one semiconductor layer 112 on sealed insulating layer 111; etching at least one separating trench 44 passing through semiconductor layer 112; and etching at least one hollowed-out section 40 into a back side 38 of substrate 100 facing away from front side 28, at least one inner region 128 of the at least one cavity 34 being stripped of a previously surrounding substrate material.

In one advantageous specific embodiment of the intermediate product, deposits 130 of the sealing material (in previous cavity inner region 128) project from a bottom surface 132 of at least one hollowed-out section 40 after the etching of the at least one hollowed-out section 40. In particular, due to the deposits 132 of sealing material projecting from bottom surface 132 of the at least one hollowed-out section 40, it may be reliably recognized that the intermediate product is produced using the above-mentioned steps of the manufacturing method.

In particular, deposits 130 may have at least one side-wall region and a covering region, which cover a hollow space 108 that is still partially situated inside of associated (remaining) cavity 34. However, at least slight damage to the wall structure of deposits 130 may also occur when cavity inner region 128 is uncovered. Therefore, it is emphasized that the production of the intermediate product using the above-mentioned method steps is also verifiable in such situations, in which the wall structure of deposits 130 is at least slightly damaged.

It is once more pointed out that in the case of the intermediate product of FIG. 2L, as well, the at least one cavity 34 is etched to have a maximum extension s parallel to front side 28, the maximum extension being greater than layer thickness d of sealed insulating layer 111 by at least a factor of 2.

Figure 2M:
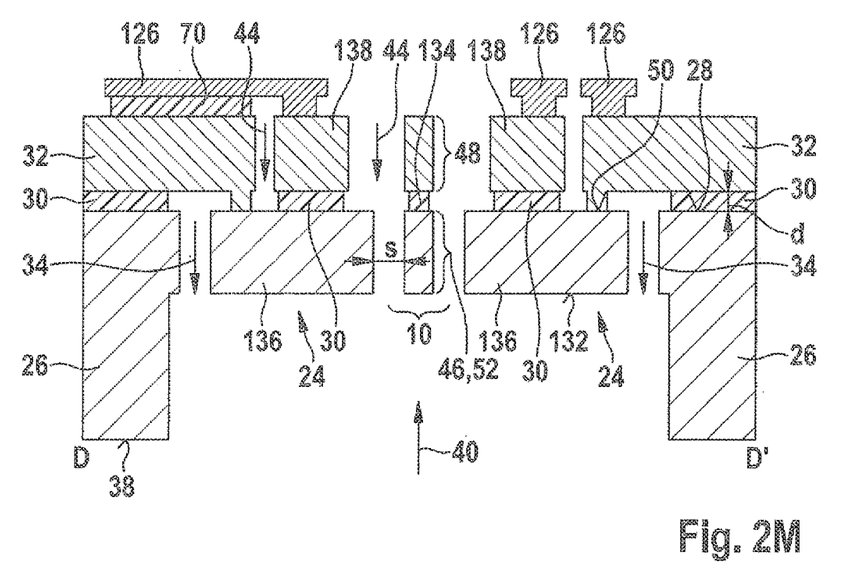

FIG. 2M shows a cross-section of a residual substrate 26 formed from the previous substrate after removing (at least) regions of the (previous) sealed insulating layer adjacent to the at least one cavity 34 and to the at least one continuous separating trench 44, in order to ensure a displaceability of a displaceable part 10 formed from the substrate material. Displaceable part 10 is connected to residual substrate 26 by at least one spring (not shown). Displaceable part 10 includes a first subunit 46 (made of the material of the previous substrate) and a second subunit 48 (made of the material of the earlier semiconductor layer), which are separated from one another by an insulating intermediate layer 134 situated between them and/or by at least one semiconductor boundary layer 50. (By removing the regions adjacent to the at least one cavity 34 and to the at least one continuous separating trench 44, insulating intermediate layer 134 is exposed as a previous partial region of the sealed insulating layer.)

Insulating layer 102 may be etched at either of the two sides 28 or 38. In the same way, insulating layer 102 may be etched from both sides 28 and 38. An isotropic or an anisotropic etching step may be carried out for etching the insulating layer.

FIG. 2M shows a cross-section of two stator electrode fingers 24. In this context, what can be seen is the structure of the two stator electrode fingers 24 each made of a first stator electrode finger region 136 surrounded by residual substrate 26 and a second stator electrode finger region 138 surrounded by residual semiconductor layer 32, the first stator electrode finger region and the second stator electrode finger region being electrically isolated from one another by a residual insulating layer 30 patterned out of the (previous) sealed insulating layer. Further details of the cross-section of FIG. 2M may be gathered from the description of FIG. 1A through 1D.

When implementing the manufacturing method described here, the individual process steps may also be executed in a process sequence different from the process sequence described here. All in all, only six patterning planes are needed for implementing the manufacturing method. Consequently, the manufacturing method described here provides an advantageous option for reducing the number of patterning planes in the production of a micromechanical component.

The manufacturing method may be implemented without a SOI substrate. In addition, during the execution of the manufacturing method, it is not necessary to first etch the upper semiconductor layer and then, during patterning of the substrate, to etch the insulating layer situated between them. In the same way, it is not necessary to etch into the substrate from the back side to release the movable structures. Consequently, in the implementation of the manufacturing method described here, the problem of having to subsequently produce necessary contacts between the upper semiconductor layer and the material of the substrate is eliminated. Thus, the manufacturing method described here simplifies conventional methods for forming a micromechanical component.

What is claimed is:

1. A micromechanical component, comprising:
    a displaceable part connected to a residual substrate by at least one spring, including:
        a first subunit and a second subunit, between which an insulating intermediate layer and at least one semiconductor boundary layer are formed;
        wherein an inner region of the first subunit aligned with the second subunit is patterned out of a substrate using at least one cavity etched in a first etching direction, and wherein an outer region of the first subunit facing away from the second subunit is patterned out of the substrate using at least one hollowed-out section etched in a second etching direction opposite to the first etching direction, and
        wherein the second subunit is patterned out of a semiconductor layer deposited onto at least one of the insulating intermediate layer and the at least one semiconductor boundary layer using at least one continuous separating trench.

2. The micromechanical component of claim 1, wherein parallel to the insulating intermediate layer, the at least one cavity has a maximum extension, which is greater than a layer thickness of the insulating intermediate layer by at least a factor of 2.

3. The micromechanical component of claim 1, wherein the at least one spring is patterned out of the semiconductor layer and spans the at least one cavity.

4. The micromechanical component of claim 1, wherein at least a partial region of the displaceable part is formed as at least one actuator electrode finger, which has a first actuator electrode finger region contained by the first subunit and a second actuator electrode finger region contained by the second subunit, and wherein the micromechanical component includes at least one stator electrode finger, which is assigned to the at least one actuator electrode finger and is made up of a first stator electrode finger region and a second stator electrode finger region electrically insulated from the first stator electrode finger region.

5. The micromechanical component of claim 4, wherein the first actuator electrode finger region, the second actuator electrode finger region, the first stator electrode finger region, and the second stator electrode finger region are contacted by a conductor track system of the micromechanical component so that, simultaneously, a first potential may be applied to the first actuator electrode finger region and to the second stator electrode finger region, and a second potential different from the first potential may be applied to the second actuator electrode finger region and to the first stator electrode finger region.

* * * * *